United States Patent
Kim et al.

(10) Patent No.: US 6,719,808 B1
(45) Date of Patent: Apr. 13, 2004

(54) METHOD OF AND APPARATUS FOR MANUFACTURING A SEMICONDUCTOR DEVICE USING A POLYSILICON HARD MASK

(75) Inventors: Ji-soo Kim, Sungnam (KR); Tae-hyuk Ahn, Yongin (KR); Won-seok Lee, Sungnam (KR); Wan-jae Park, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 393 days.

(21) Appl. No.: 09/695,068

(22) Filed: Oct. 25, 2000

(30) Foreign Application Priority Data

Oct. 27, 1999 (KR) .................................. 1999-46909

(51) Int. Cl.$^7$ .......................................... H01L 21/302
(52) U.S. Cl. ...................................... 438/710; 438/719
(58) Field of Search .................. 438/710, 706, 438/712, 719, 723, 733, 740

(56) References Cited

U.S. PATENT DOCUMENTS

| | | | | |
|---|---|---|---|---|
| 4,073,289 A | | 2/1978 | Fahim ........................... | 128/24 |
| 4,654,112 A | * | 3/1987 | Douglas et al. ............. | 438/723 |
| 5,458,734 A | * | 10/1995 | Tsukamoto ................. | 438/701 |
| 5,562,801 A | * | 10/1996 | Nulty ........................... | 438/695 |
| 5,705,419 A | * | 1/1998 | Perry et al. .................. | 438/588 |
| 5,769,790 A | | 6/1998 | Watkins et al. ............. | 600/439 |
| 5,780,338 A | * | 7/1998 | Jeng et al. .................... | 438/253 |
| 5,914,279 A | * | 6/1999 | Yang et al. .................. | 438/724 |
| 6,063,548 A | * | 5/2000 | Chu et al. .................... | 430/314 |
| 6,103,455 A | * | 8/2000 | Huang et al. ................ | 430/313 |
| 6,107,140 A | * | 8/2000 | Lee et al. ..................... | 438/259 |
| 6,136,695 A | * | 10/2000 | Lee et al. ..................... | 438/637 |
| 6,162,367 A | * | 12/2000 | Tai et al. ........................ | 216/79 |

FOREIGN PATENT DOCUMENTS

JP  2-262334  10/1990

* cited by examiner

Primary Examiner—Kin-Chan Chen
(74) Attorney, Agent, or Firm—Volentine Francos, PLLC

(57) ABSTRACT

A method and apparatus for use in manufacturing a semiconductor device strips a polysilicon hard mask without damaging the layer left exposed by openings formed by using the polysilicon hard mask as an etching mask. The method includes forming a polysilicon hard mask in a pattern on a first layer to expose a portion of the first layer, dry etching the exposed portion of the first layer using the polysilicon hard mask as an etching mask to form an opening in the first layer, and thereafter removing the polysilicon hard mask by supplying an etching gas onto the polysilicon hard mask in a direction parallel to the major surface of the semiconductor substrate. The processing apparatus includes a reaction chamber including a spin chuck which supports the semiconductor substrate for rotation, a gas supply unit for supplying a process gas to the reaction chamber, a gas injection unit for injecting the process gas supplied by the gas supply unit into the reaction chamber in a direction parallel to the major surface of the semiconductor substrate, and an exhaust unit for exhausting gases from the reaction chamber.

16 Claims, 4 Drawing Sheets

METHOD OF AND APPARATUS FOR MANUFACTURING A SEMICONDUCTOR DEVICE USING A POLYSILICON HARD MASK

BACKGROUND OF THE INVENTION

1. Field of the Invention

The present invention relates to a method of manufacturing a semiconductor device. More particularly, the present invention relates to a method of selectively etching a layer using a polysilicon hard mask, and to an apparatus for etching away the polysilicon hard mask, in manufacturing a semiconductor device.

2. Description of the Related Art

The increasing demand for highly integrated, high-capacity and high-performance semiconductor devices has fueled the need for advances in semiconductor integrated circuit manufacturing technology. The manufacturing of integrated circuits typically involves selectively etching a variety of material layers to form openings such as contact holes or trenches. To produce an integrated circuit having a high integration density, the openings in the material layers must be formed by a wafer processing technique for creating a fine pattern having a line width on the order of several micrometers at most. Research and development in the area of such a technique, with the aim of forming deeper and smaller openings, has concentrated on so-called dry etching.

In a common etching technique used to form openings, such as contact holes, in a target layer on a semiconductor wafer, a photoresist pattern is formed on the target layer (for example, on an oxide layer), and the portions of the target layer which are exposed by the photoresist pattern are dry etched using the photoresist pattern as an etching mask. The smaller the desired contact holes, the lower the etching rate must be. Because the thickness of the photoresist pattern can dictate the etching rate, the photoresist pattern to be used as an etching mask must be thick if the contact holes are to be small. For instance, for a 280 nm metal contact, if an oxide layer to be dry etched has a thickness of about 1.5 $\mu$m, a photoresist pattern having a relatively high thickness of about 1.6 $\mu$m is required.

However, future generation photolithography processes use an ArF eximer laser. On the other hand, a photoresist layer having a thickness of 300 nm or more is not sensitive to light of the wavelength produced by an ArF laser. Therefore, the typical photoresist is impractical for use in forming small contact holes.

Thus, a hard mask formed of polysilicon, $Al_2O_3$, $Si_3N_4$ or SiON must be used in forming deeper and smaller contact holes. Of these masks, the one of polysilicon is now widely being used.

In a conventional manufacturing technique using a hard mask of polysilicon, after the polysilicon mask is used in the etching process, the mask is stripped by chemical mechanical polishing (CMP), wet etch back, or dry etch back processes.

However, stripping the polysilicon hard mask using CMP is costly and CMP cannot completely remove the hard mask due to steps on the wafer. The wet etch back technique exhibits a good etching selectivity with respect to other layers, but it can cause damage during a drying step after the etching process. In addition, the etchant used in the wet etch back technique can penetrate to other non-target layers, whereby the other layers are inadvertently etched.

The conventional dry etching process employed in removing the polysilicon hard mask is relatively simple. However, the etch selectivity with respect to other non-target layers is not very good. Therefore, a non-target material layer can be removed along with the hard mask during the stripping process. In particular, if pads or conductive layers exposed through the contact holes formed by the dry etching are of the same material as the polysilicon hard mask, e.g. are of the same polysilicon, single crystal silicon or metal silicide, the pads or the conductive layers can be removed when the hard mask is stripped from the target layer.

SUMMARY OF THE INVENTION

It is an object of the present invention to solve the above-described problems of the prior art.

More specifically, a first object of the present invention is to provide a method of manufacturing a semiconductor device, in which a polysilicon hard mask used for forming openings in a semiconductor wafer can be removed easily and at low cost without adversely affecting material layers left exposed by the openings.

Another object of the present invention is to provide an apparatus for manufacturing a semiconductor device, by which a hard mask only can be removed from a semiconductor substrate even after a layer of the same material as the hard mask is left exposed by openings formed using the hard mask.

The objects of the present invention are achieved by a method and apparatus in which an etching gas, used to strip the polysilicon hard mask after the mask has been used to form openings in a target layer on a semiconductor substrate, is supplied in a direction substantially parallel to the major upper surface of the semiconductor substrate.

The semiconductor substrate is mounted to a chuck within a reaction chamber. A gas injection unit in the form of a shower head mounted to the inner sidewall of the reaction chamber is used to supply the etching gas into the chamber in the direction parallel to the major surface of the semiconductor substrate. The chuck is preferably a spin chuck. The semiconductor substrate is rotated by the spin chuck while the polysilicon hard mask is exposed to the etching gas, whereby the etching gas is distributed uniformly to ensure a uniform dry etching of the polysilicon hard mask.

The etching gas preferably comprises a halogen fluoride compound selected from the group consisting of ClF, $ClF_3$, BrF, $BrF_3$, $BrF_5$, IF, $IF_3$ and $IF_5$ or a flourine-containing compound such as $XeF_2$. Moreover, the etching gas can be supplied using a carrier gas, such as nitrogen or argon. The dry etching of the polysilicon hard mask can be carried out at a pressure of only several tens of mTorr or less, and at room temperature.

Moreover, the process gas is preferably supplied into the reaction chamber as a series of pulses of a predetermined period. A puff valve connected in-line between a gas supply unit and the reaction chamber, and in particular, between the gas supply unit and the gas injection unit, is operative to supply the etching gas into the reaction chamber as a series of pulses.

According to the present invention as summarized above, the mean free path of the etching gas in the lateral direction of the semiconductor substrate is significantly longer than that of etching gas conventionally supplied perpendicular to the major upper surface of a semiconductor substrate. Therefore, even if the layer exposed in the openings in the polysilicon hard mask is of a silicon-containing material, the polysilicon hard mask can be effectively removed without damaging that silicon-containing layer.

BRIEF DESCRIPTION OF THE DRAWINGS

The above and other objects, features and advantages of the present invention will become more apparent by referring to the following detailed description of the preferred embodiments thereof made with reference to the attached drawings, of which.

DETAILED DESCRIPTION OF THE PREFERRED EMBODIMENTS

Figure 1:
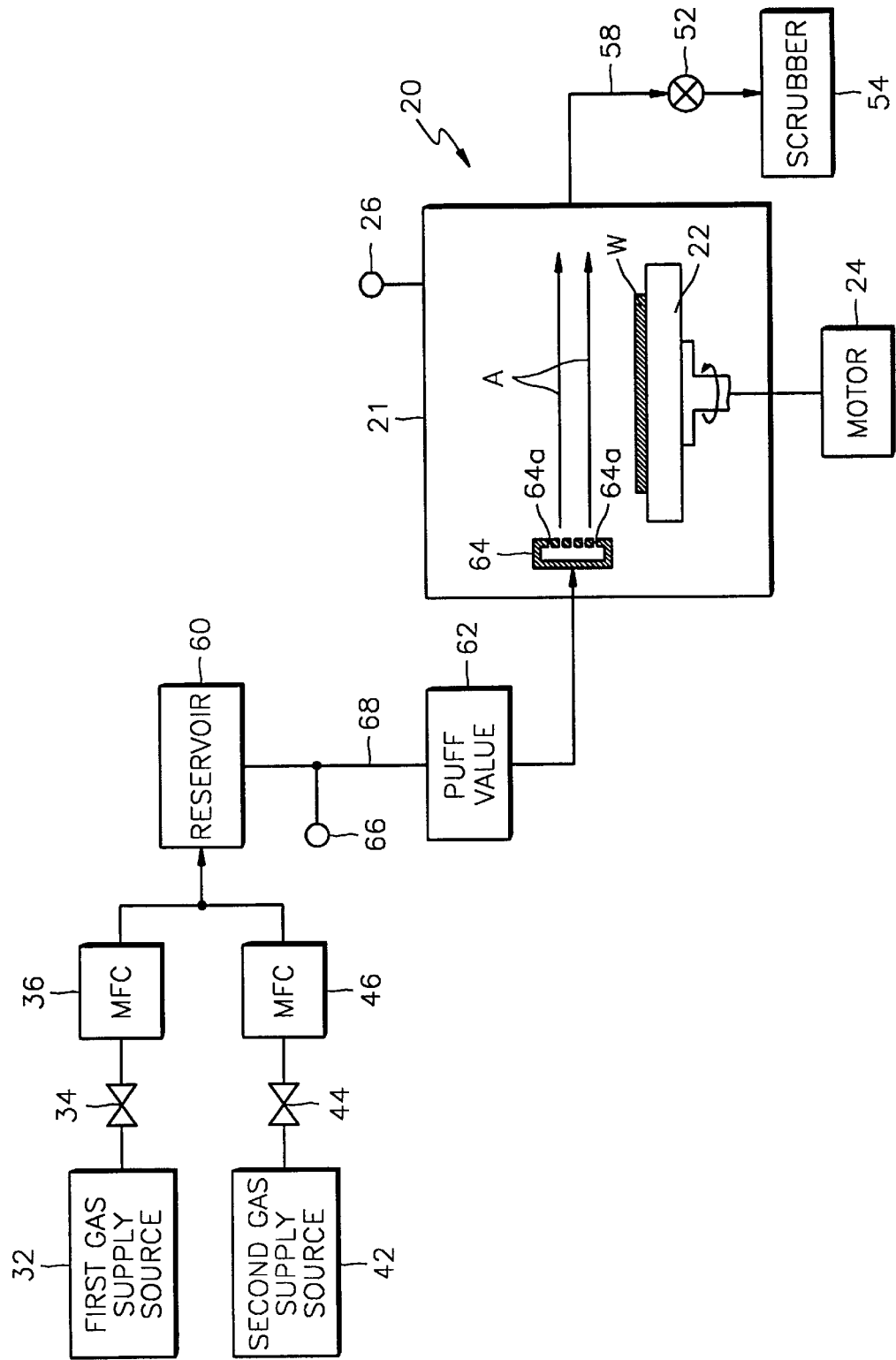
FIG. 1 is a schematic diagram of an apparatus for manufacturing a semiconductor device according to the present invention.

With reference to FIG. 1, the semiconductor device manufacturing apparatus includes a reaction chamber 20, in which an unnecessary material layer on a semiconductor wafer W is dry etched in a predetermined atmosphere, and a gas supply unit for supplying process gases into the reaction chamber 20.

The gas supply unit includes two gas supply sources 32 and 42 which contain process gases used for removing unnecessary material from the semiconductor wafer W. In particular, the first gas supply source 32 contains a source(s) of etching gases for etching away the unnecessary material, and the second gas supply source 42 contains a carrier gas. The etching gases of the first gas supply source 32 include halogen fluorides such as $ClF$, $ClF_3$, $BrF$, $BrF_3$, $BrF_5$, $IF$, $IF_3$ and $IF_5$, or a fluorine-containing compound such as $XeF_2$. However, the process gas is not limited to these gases. The carrier gas contained in the second gas supply source 42 may be nitrogen or argon.

In addition, the semiconductor device manufacturing apparatus according to the present invention includes a gas injection unit 64 for injecting the process gases from the first and second gas supply sources 32 and 42 into the reaction chamber 20 in the direction indicated by arrows A in FIG. 1, i.e., parallel to the major surface of the semiconductor wafer W.

The gas injection unit 64 is connected to the first and second gas supply sources 32 and 42 through a pipe 68. The supplying of gas from the first and second gas supply sources 32 and 42 is controlled by shut-off valves 34 and 44, which are connected to the first and second gas supply sources 32 and 42, respectively. The flow rate of the gas is controlled by mass flow controllers (MFCs) 36 and 46, which are connected in respective lines extending from the first and second gas supply sources 32 and 42.

The process gases from the first and second gas supply sources 32 and 42 are mixed in a reservoir 60, and introduced into the reaction chamber 20 through the feed pipe 68 and the gas injection unit 64. Also, a pressure gauge 66 is disposed on the feed pipe 68 so as to monitor the pressure of the process gases issuing from the reservoir 60.

However, the reservoir 60 can be omitted. In this case, the process gases from the first and second gas supply sources 32 and 42, whose flow rates are controlled by the MFCs 36 and 46, are supplied directly into the reaction chamber 20. During an etching process, the etching gas and the carrier gas can be simultaneously supplied by appropriately controlling the shut-off valves 34 and 44 as needed. Alternatively, the shut-off valves 34 and 44 can be controlled such that only the etching gas from the first gas supply source 32 is supplied.

The gas injection unit 64 may comprise a shower head capable of injecting the process gases in the direction parallel to the major surface of the semiconductor wafer W, in which case the shower head is disposed adjacent the inner sidewall of the reaction chamber 20. The shower head may have a number of gas injection openings 64a each having a diameter of, for example, several millimeters. The gas injection openings 64a are uniformly arrayed over the entire front face of the shower head, so that the number of the gas injection openings 64a per unit area is constant over the entire front face of the shower head. As a result, the gas injection amount, i.e., the amount of gas supplied per unit area at the front of the shower head, is uniform. The process gases are thus supplied at a constant rate through the gas injection unit 64 into the reaction chamber 20.

A spin chuck 22 for supporting the semiconductor wafer W horizontally is disposed inside the casing 21 of the reaction chamber 20. The spin chuck 22 can be rotated by a motor 24. The semiconductor wafer W is rotated by the spin chuck 22 while the process gas is introduced into the reaction chamber 20 through the gas injection unit 64, so that the process gas can be uniformly supplied over the top surface of the semiconductor wafer W.

A heating means (not shown) can be integrated with the spin chuck 22 so as to control the temperature of the semiconductor wafer W during processing.

An exhaust pump 52 is connected to the reaction chamber 20 through an exhaust pipe 58. The exhaust pump 52 evacuates the reaction chamber 20 down to near high vacuum levels. The reaction chamber 20 has a pressure gauge 26 for monitoring the pressure inside the casing 21.

When an etching process is carried out in the reaction chamber 20, the reaction gas is exhausted from the reaction chamber 20 by the exhaust pump 52. The exhaust flows through the exhaust pipe 58 to a scrubber 54. The scrubber 54 adsorbs toxic gases exhausted from the reaction chamber 20.

In addition, a puff valve 62 is disposed in-line upstream of the gas injection unit 64 to cause the process gases from the reservoir 60 to be supplied in puffs, i.e. as a series of pulses, into the reaction chamber 20 in a predetermined sequence.

Figure 2A:
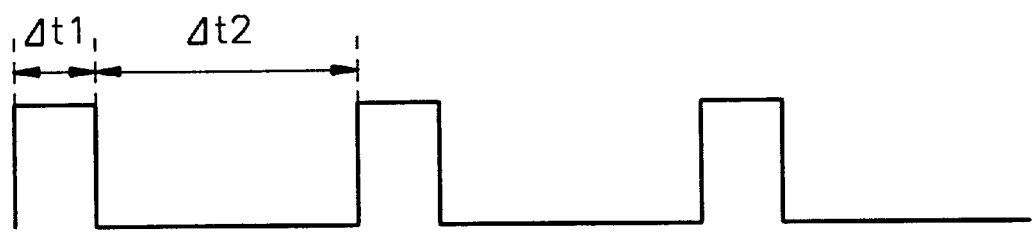
FIG. 2A is an illustration of a gas pulsing technique executed according to the present invention.
Figure 2B:
FIG. 2B is an illustration of a pressure variation within the reaction chamber of the semiconductor manufacturing apparatus during the course of the gas pulsing technique.

FIG. 2A illustrates this sequence of supplying gas into the reaction chamber 20 using the puff valve 62, and FIG. 2B illustrates the pressure variation in the reaction chamber 20 during the pulsing of gas by the puff valve 62.

In FIG. 2A, $\Delta t1$ designates the time during which the process gas is supplied into the reaction chamber 20. During the time $\Delta t1$, the process gas from the reservoir 60 is supplied into the reaction chamber 20 through the pipe 68, and the reaction chamber 52 is simultaneously evacuated by the exhaust pump 52. $\Delta t2$ designates the time during which the process gas does not flow into the reaction chamber 20. During the time $\Delta t2$, the reaction chamber 20 is being evacuated by the exhaust pump 52, while the flow of process gas into the reaction chamber 20 is cut off.

The rate R of etching polysilicon on a semiconductor wafer with $BrF_3$, as a function of the temperature of the semiconductor wafer in an equilibrium state of the etching reaction, can be expressed by Arrhenius' equation as follows:

$$R(Å/min) = 1.16E-18 \times n \times T^{1/2} \exp(-E_a/kT) \quad (1)$$

In formula (1), n represents the density of $BrF_3$, $E_a$ represents the effective activation energy of the etching reaction, k represents the Boltzmann constant ($1.987 \times 10^{-3}$ kcal/mole/° K.), and T represents the temperature of the semiconductor wafer in ° K. (refer to *J. Appl. Phys.* 56(10), 2939,1984, by D. E. Ibbotson et al.).

As can be understood from the formula (1), when the pressure of the reaction chamber reaches several hundreds of mTorr to several Torr as a predetermined amount of $BrF_3$ flows into the reaction chamber, the etching rate increases to as fast as several thousand Å/min to several µm/min. In this case, the mean free path of $BrF_3$ in the gaseous phase is as short as several µm.

In the case where a layer of silicon-containing material such as polysilicon or a metal silicon is exposed in the openings in a polysilicon hard mask, a conventional technique of etching away the polysilicon hard mask using $BrF_3$ as an etching gas may also remove the silicon-containing material. Thus, in the case where the material layer exposed in the openings is of a silicon-containing material, one could not use the conventional technique of stripping the polysilicon hard mask using $BrF_3$ without seriously risking damage to the material layer.

To avoid this problem, the semiconductor device manufacturing apparatus according to the present invention supplies the etching gas in a direction parallel to the major surface of the semiconductor wafer such that the mean free path of the etching gas molecules is increased, and the etching rate can be accurately controlled over the entire surface of the semiconductor wafer.

In the semiconductor device manufacturing apparatus according to the present invention, while the pressure of the reaction chamber 20 is maintained as low as several tens of mTorr, the process gases are supplied into the reaction chamber 20 in the direction parallel to the major surface of the semiconductor wafer W by the gas injection unit 64. In addition, the process gases are supplied in pulses into the reaction chamber 20 using the puff valve 62.

Generally, the capacity of the reaction chamber 20 is several tens of times greater than the capacity of the reservoir 60. In this case, if the pressure inside the reservoir 60 is maintained at several Torr, the peak pressure of the reaction chamber 20, which is determined by the pulse-type supply of the process gases into the reaction chamber 20, will be as low as about several tens of mtorr. In this case, the mean free path of the etching gases in the horizontal direction is increased to the order of millimeters, and the etching rate in the reaction chamber 20 reaches several hundreds of Å/min during the time the etching gas is flowing into the chamber, i.e., during the time Δt1.

In order to adequately etch the polysilicon layer away in the horizontal direction, the time Δt1 for supplying the etching gas into the reaction chamber 20, as shown in FIG. 2A, is preferably set within a range pf several tens of seconds to several minutes. The time Δt2 during which the supply of etching gases is cut off, is set to be several times the time Δt1 according to the exhaust capacity. If the time Δt1 is about 1 minute, the polysilicon hard mask, remaining after the openings are formed, has a thickness of several thousand Å and can be completely removed by pulsing the supply gas merely several tens of times, and without damaging the other material layers exposed in the openings. In addition, the semiconductor wafer W is preferably rotated at several tens of rpms while the process gases are supplied (pulsed) to thereby produce a uniform etching of the entire surface of the semiconductor wafer W.

In the operation of the semiconductor device manufacturing apparatus according to the present invention, a semiconductor wafer W on which a polysilicon hard mask remains is loaded on the spin chuck 22 in the reaction chamber 20. Then, the reaction chamber 20 and the reservoir 60 are evacuated down to 1 mTorr or less. The puff valve 62 is closed so that the reservoir 60 is filled with an etching gas, for example, $BrF_3$. Then, the puff valve 62 is turned on and off such that $BrF_3$ is supplied to the reaction chamber 20 in pulses as represented in FIG. 2A. The gas injection unit 64 causes the etching gas from the reservoir 60 to be supplied into the reaction chamber 20 in a direction parallel to the major surface of the semiconductor wafer W. During the pulsing operation of the puff valve 62, the reaction chamber 20 is continuously evacuated by the exhaust pump 52. While the etching gas is supplied into the reaction chamber 20, the semiconductor wafer W is rotated at a low speed by the spin chuck 22 so that the etching gas is uniformly distributed over the semiconductor wafer W.

Because the etching gas is supplied into the reaction chamber in a direction parallel to the major surface of the semiconductor wafer in a series of pulses while the pressure of the reaction chamber is maintained at low levels, the mean free path of the etching gas in the lateral direction of the semiconductor wafer is long. As a result, the polysilicon hard mask can be effectively removed from the semiconductor wafer without the exposed material layer being damaged even if the exposed material layer contains silicon.

Next, preferred embodiments of the method of manufacturing a semiconductor device according to the present invention will now be described more fully with reference to FIGS. 3A–4B. In these drawings, the thickness of layers and regions are exaggerated for the sake of clarity. It should also be understood that when a layer is referred to as being "on" another layer or substrate, such a description means that the layer can be disposed directly on the other layer or substrate, or intervening layers may be present therebetween.

Figure 3A:
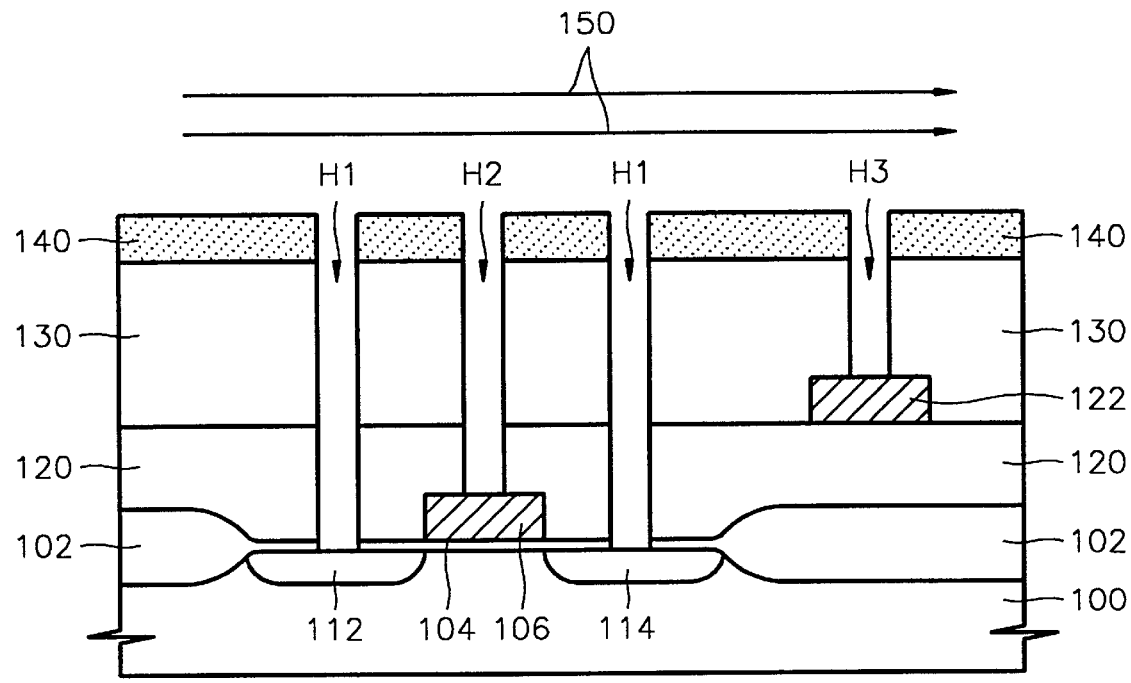
FIGS. 3A and 3B are sectional views of a semiconductor wafer, illustrating an embodiment of a method for use in manufacturing a semiconductor device according to the present invention.

Referring now to FIG. 3A, reference numeral 100 designates a substrate formed of, for example, silicon or epitaxial silicon. A field oxide layer 102 is formed over the substrate 100 to define active regions. A gate oxide layer 104, a gate electrode 106, a source region 112 and a drain region 114 are formed over the substrate 100. The gate electrode 106 may be a single conductive layer of, for example, polysilicon, or a composite layer of polysilicon and metal silicide stacked one atop the other.

Reference numeral 122 designates a conductive pattern for bit lines or conductive pads formed over a first interlayer dielectric (ILD) film 120. The conductive pad 122 is covered with a second ILD film 130.

In the manufacture of common semiconductor devices, via holes or openings (hereinafter, simply referred to as contact holes) are formed through the second or first ILD film. The contact holes are filled with a conductive material such as aluminum (Al), tungsten (W) or polysilicon. Because the contact holes of a semiconductor device having a high integration density are so small and deep, they cannot be made using a typical photolithography technique. To form such small and deep contact holes, a polysilicon hard mask 140 must be formed on the second ILD film 130 as an etching mask.

Contact holes H1, H2 and H3 are thus formed using the hard mask 140 as an etching mask. The contact holes H1 are formed through the second and first ILD films 130 and 120 to expose the source region 112 and the drain region 114. The contact hole H2 is formed through the second and first ILD films 130 and 120 to expose the top of the gate electrode 106, and the contact hole H3 is formed only through the second IDL film 130 to expose the top of the conductive pattern 122.

Then, the substrate 100 is loaded into the reaction chamber 20 of the semiconductor device manufacturing apparatus, as shown in FIG. 1, so as to remove the polysilicon hard mask 140.

Next, the etching gas 150, which is effective in removing the polysilicon hard mask 140, is supplied into the reaction chamber 20 in the direction indicated by the arrows A in FIG. 1, i.e., parallel to the major surface of the substrate 100. Compounds capable of reacting with silicon in a gas-phase without generating plasma include halogen fluorides such as ClF, $ClF_3$, BrF, $BrF_3$, $BrF_5$, IF, $IF_3$ and $IF_5$, and fluorine-containing compounds such as $XeF_2$.

Most of the exemplary etching gases above include an ionic bond between elements of different groups of the periodic table, and have very low bonding energies. In other words, because the etching gases are in an unstable state, the etching gases are highly likely to react with silicon.

Also, the etching gas may be supplied together with a carrier such as nitrogen or argon. The etching gas is supplied periodically, i.e., in pulses, over the substrate 100 using, for example, the puff valve 62 shown in FIG. 1. In order to uniformly distribute the etching gas 150 over the polysilicon hard mask 140 on the substrate 100, the substrate 100 is rotated by the spin chuck 22 at relatively low speeds, for example, at several tens of rpms.

As a result, the mean free path of the etching gas 150 is rather long. While the etching gas 150 is supplied over the substrate 100, parallel to the major surface of the substrate 100, the reaction chamber 20 is evacuated by the exhaust pump 52. By flowing horizontally over the substrate 100, the etching gas 150 contacts the polysilicon hard mask 140 but does not to flow into the contact holes H1, H2 and H3.

Figure 3B:
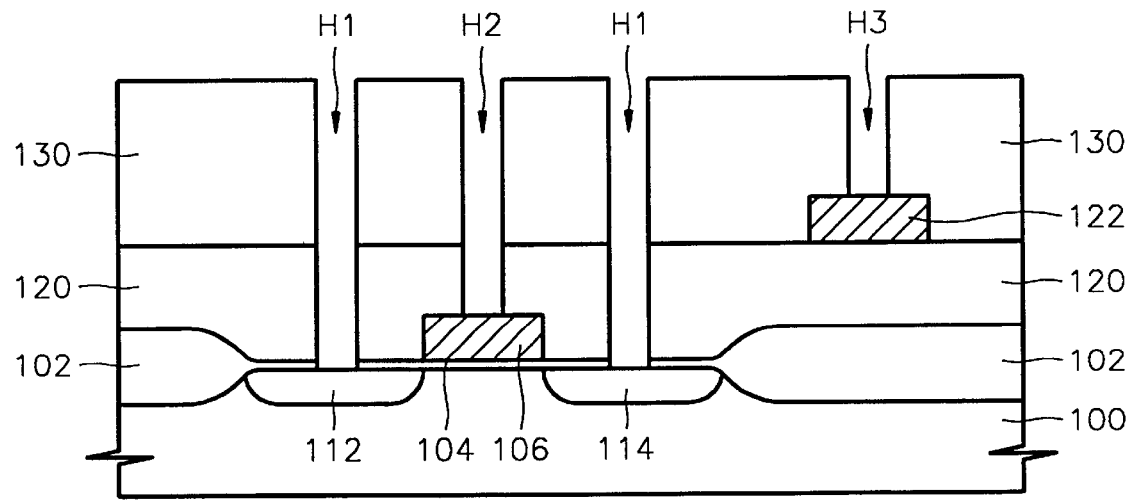

Thus, as shown in FIG. 3B, the polysilicon hard mask 140 can be completely removed without damaging the gate electrode 106, the source region 112, the drain region 114 and the conductive pattern 122, which are all exposed in the contact holes H1, H2 and H3.

Although the present invention has been described with respect to the formation of contact holes used, in turn, for forming connections with conductive patterns, such as gate electrodes, source regions, drain regions, bit lines or pads, the method of the present invention can also be applied to other semiconductor manufacturing processes for forming small openings. For example, the method can be applied to forming via holes between first and second metal layers, second and third metal layers, or first and third metal layers.

In addition, the method of manufacturing a semiconductor device according to the present invention can be applied to forming openings other than contact holes. For example, as shown in FIGS. 4A and 4B, the method of manufacturing a semiconductor device according to the present invention can be applied to forming isolation trenches which are smaller than those which can be formed using a typical lithography process.

Figure 4A:
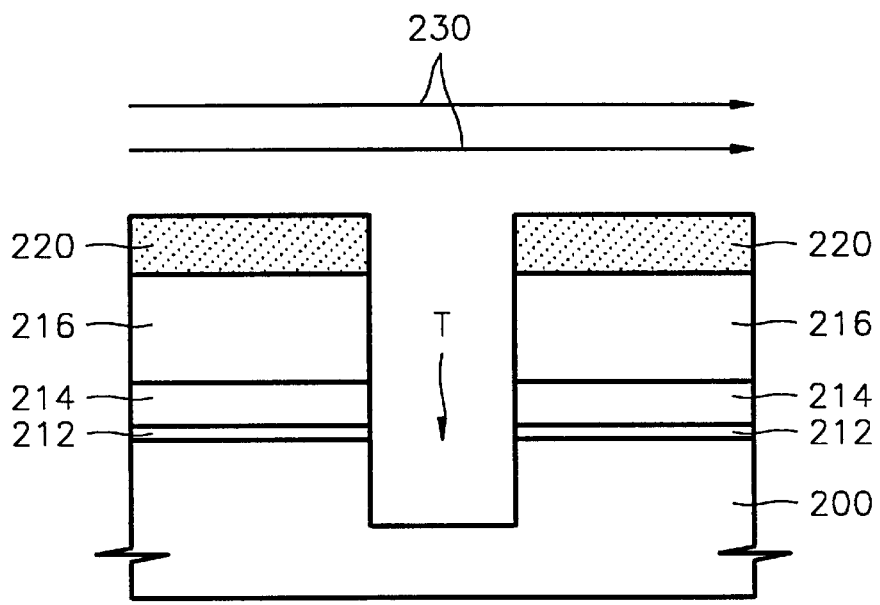
FIGS. 4A and 4B are sectional views of a semiconductor wafer, illustrating another embodiment of a method for use manufacturing a semiconductor device according to the present invention.
Figure 4B:
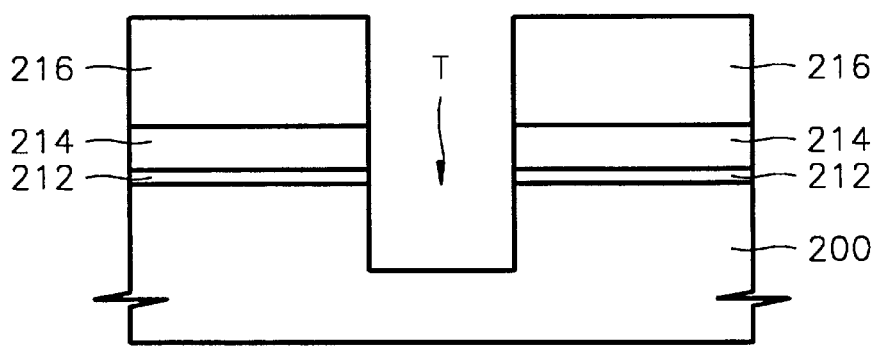

In FIG. 4A, reference numeral 200 designates a substrate made of, for example, silicon or epitaxial silicon. Reference numeral 212 designates a pad oxide layer, reference numeral 214 designates a silicon nitride layer, and reference numeral 216 designates a silicon oxide layer.

A polysilicon hard mask 220, which defines a trench region, is formed on the silicon oxide layer 216. Then, the silicon oxide layer 216, the silicon nitride layer 214 and the pad oxide layer 212 are anisotropically etched using the polysilicon hard mask 220 as an etching mask. Then, the exposed substrate 200 is further etched to form a trench T.

Next, the polysilicon hard mask 220 is removed by the same technique described with reference to FIG. 3A. As a result, as shown in FIG. 4B, the polysilicon hard mask 220 is completely removed without damaging the exposed surface of the substrate 200 defining the bottom of the trench T.

Still further, the process for use in manufacturing a semiconductor device according to the present invention is not limited to the embodiments described above. For example, the inventive method can be adopted in etching the back side of a wafer. That is, a compound capable of etching a silicon material layer in a gas-phase without generating plasma is used as an etching gas, and the etching gas is supplied to the back side of a wafer in a direction parallel to the major surface of the wafer, so that the back side of the wafer can be selectively etched. In this case, compared to a common technique for etching the back side of a wafer by wet or plasma etching, the number of processing steps can be decreased, thereby lowering the processing cost.

Finally, although the present invention has been particularly shown and described with reference to the preferred embodiments thereof, various changes in form and details, as will be apparent to those of ordinary skill in the art, may be made thereto without departing from the true spirit and scope of the invention as defined by the appended claims.

What is claimed is:

1. An etching process for use in manufacturing a semiconductor device, comprising:

forming a first layer on a semiconductor substrate;

forming a polysilicon hard mask on the first layer, the polysilicon hard mask having a pattern such that a portion of the first layer is exposed;

dry etching the exposed portion of the first layer using the polysilicon hard mask as an etching mask to form an opening in the first layer; and supplying an etching gas onto the polysilicon hard mask in a direction substantially parallel to the major upper surface of the semiconductor substrate to thereby dry etch the polysilicon hard mask.

2. The process of claim 1, and further comprising forming a conductive layer on the semiconductor substrate, and wherein the forming of the first layer comprises forming a dielectric film on the conductive layer.

3. The process of claim 1, wherein the dry etching of the first layer forms an opening which exposes the surface of the semiconductor substrate, and further comprising subsequently etching the exposed portion of the semiconductor substrate to form a trench in the semiconductor substrate.

4. The process of claim 1, wherein the supplying of an etching gas comprises supplying an etching gas which reacts with the silicon of the polysilicon hard mask.

5. The process of claim 1, wherein the supplying of an etching gas comprises supplying a fluorine-containing compound.

6. The process of claim 5, wherein the etching gas comprises at least one halogen fluoride selected from the group consisting of ClF, $ClF_3$, BrF, $BrF_3$, $BrF_5$, IF, $IF_3$ and $IF_5$.

7. The process of claim 5, wherein the etching gas comprises $XeF_2$.

8. The process of claim 1, wherein the dry etching of the polysilicon hard mask comprises supplying the etching gas along with a carrier gas.

9. The process of claim 8, wherein the carrier gas is one of nitrogen and argon.

10. The process of claim 1, wherein the dry etching of the polysilicon hard mask comprises rotating the semiconductor substrate while the polysilicon hard mask is exposed to the etching gas.

11. The process of claim 1, wherein the dry etching of the polysilicon hard mask comprises supplying the etching gas in a series of pulses of a predetermined period.

12. The process of claim 11, wherein the dry etching of the polysilicon hard mask is carried out at a pressure of at most several tens of mTorr.

13. The process of claim 11, wherein the dry etching of the polysilicon hard mask is carried out at room temperature.

14. The process of claim 11, wherein the dry etching of the polysilicon hard mask comprises rotating the semiconductor substrate while the polysilicon hard mask is exposed to the etching gas.

15. The process of claim 1, and further comprising loading the substrate into a reaction chamber, and wherein the supplying of an etching gas onto the polysilicon hard mask comprises supplying the etching gas into the atmosphere within said reaction chamber in a direction substantially parallel to the major upper surface of the semiconductor substrate loaded in the chamber.

16. The process of claim 1, wherein the etching gas is supplied onto the polysilicon hard mask in a direction substantially parallel to the major upper surface of the semiconductor substrate while said opening in the first layer is unfilled, to thereby completely remove the hard mask.

* * * * *